(12) United States Patent
Finney et al.

(10) Patent No.: US 10,931,272 B2
(45) Date of Patent: Feb. 23, 2021

(54) TRANSISTOR ARRANGEMENT WITH A LOAD TRANSISTOR AND A SENSE TRANSISTOR

(71) Applicant: Infineon Technologies AG, Neubiberg (DE)

(72) Inventors: Adrian Finney, Villach (AT); Cristian Mihai Boianceanu, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/825,681

(22) Filed: Mar. 20, 2020

(65) Prior Publication Data

US 2020/0304117 A1 Sep. 24, 2020

(30) Foreign Application Priority Data

Mar. 22, 2019 (DE) .......................... 10 2019 107 442

(51) Int. Cl.
| | |
|---|---|
| *H03K 3/00* | (2006.01) |
| *H03K 17/081* | (2006.01) |
| *H03K 17/082* | (2006.01) |
| *H03K 17/14* | (2006.01) |
| *H03K 17/08* | (2006.01) |

(52) U.S. Cl.
CPC ....... *H03K 17/0822* (2013.01); *H03K 17/145* (2013.01); *H03K 2017/0806* (2013.01)

(58) Field of Classification Search
CPC ............. H03K 17/0822; H03K 17/145; H03K 2017/0806
See application file for complete search history.

(56) References Cited

U.S. PATENT DOCUMENTS

| | | | |
|---|---|---|---|
| 5,153,696 A | 10/1992 | Kayama | |
| 5,801,573 A * | 9/1998 | Kelly | .................. H01L 29/7803 327/434 |
| 5,877,617 A | 3/1999 | Ueda | |
| 7,365,559 B2 * | 4/2008 | Colbeck | ............. G01R 19/0092 324/762.09 |
| 9,087,707 B2 * | 7/2015 | Mauder | ............... H01L 29/7801 |
| 10,084,441 B2 * | 9/2018 | Meiser | ................ H01L 27/0727 |
| 10,388,782 B2 * | 8/2019 | Bernacchia | ......... H01L 29/7815 |
| 2008/0088355 A1 | 4/2008 | Von Borcke et al. | |

FOREIGN PATENT DOCUMENTS

DE 102015111360 A1 1/2016

\* cited by examiner

*Primary Examiner* — Kenneth B Wells
(74) *Attorney, Agent, or Firm* — Murphy, Bilak & Homilier, PLLC

(57) ABSTRACT

A transistor arrangement and an electronic circuit with a transistor arrangement are disclosed. The transistor arrangement includes: drift and drain regions arranged in a semiconductor body and connected to a drain node; at least one load transistor cell having a source region integrated in a first active region of the semiconductor body; at least one sense transistor cell having a source region integrated in a second active region of the semiconductor body; a first source node electrically coupled to the source region of the at least one load transistor cell; a second source node electrically coupled to the source region of the at least one sense transistor cell; and a compensation resistor connected between the source region of the at least one sense transistor cell and the second source node. The compensation resistor is integrated in the semiconductor body and has a resistive conductor which includes a doped semiconductor material.

19 Claims, 9 Drawing Sheets

TRANSISTOR ARRANGEMENT WITH A LOAD TRANSISTOR AND A SENSE TRANSISTOR

TECHNICAL FIELD

This disclosure in general relates to a transistor arrangement with a load transistor and a sense transistor.

BACKGROUND

Transistors such as MOSFETs (Metal Oxide Semiconductor Field-Effect Transistors) are widely used as electronic switches in various types of electronic circuits. In many applications it is desirable to measure the current flowing through the transistor.

One way of measuring a load current provided by a transistor (which may be referred to as a load transistor) to a load is using a sense transistor. The sense transistor is connected to the load transistor and driven such that it is operated at the same operating point as the load transistor. Ideally, a sense current through the sense transistor is proportional to the load current, wherein a proportionality factor is given by a ratio between a size of the load transistor and a size of the sense transistor. The load transistor and the sense transistor may be implemented in a common semiconductor body and each include a plurality of transistor cells. The size ratio may then be equivalent to a ratio between the number of transistor cells of the sense transistor and the number of transistor cells of the load transistor or equivalent to a ratio between the size of an active area of the sense transistor and the size of an active area of the load transistor.

Due to parasitic effects, however, a proportionality factor between the sense current and the load current, which is referred to as current ratio in the following, does not exactly match the size ratio. In particular, these parasitic effects may have the effect that a deviation of the current ratio from the size ratio increases as the size of the sense transistor decreases relative to the size of the load transistor. Further the current ratio may change as a temperature of the transistor arrangement changes.

SUMMARY

It is therefore desirable to provide a transistor arrangement with a load transistor and a sense transistor which enables precisely measuring a load current in the load transistor using the sense transistor.

One example relates to a transistor arrangement. The transistor arrangement includes a drift and drain region arranged in a semiconductor body and connected to a drain node, at least one load transistor cell including a source region integrated in a first active region of the semiconductor body, at least one sense transistor cell including a source region integrated in a second active region of the semiconductor body, a first source node electrically coupled to the source region of the at least one load transistor cell, a second source node electrically coupled to the source region of the at least one sense transistor cell, and a compensation resistor connected between the source region of the at least one sense transistor cell and the second source node. The compensation resistor is integrated in the semiconductor body and includes a resistive conductor, wherein the resistive conductor includes a doped semiconductor material.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
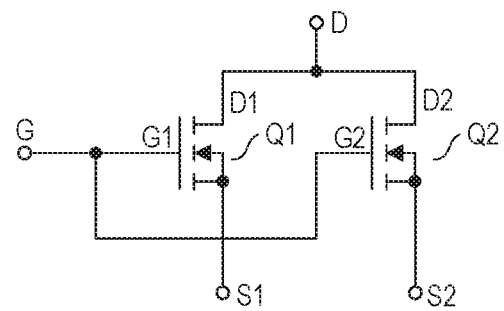
FIG. 1 shows a circuit diagram of a transistor arrangement with a load transistor and a sense transistor.

FIG. 1 shows a circuit diagram of one example of a transistor arrangement that includes a first transistor Q1 and a second transistor Q2. In this type of transistor arrangement, the first transistor Q1 may be used as an electronic switch that switches a current received by a load (not shown in FIG. 1), and the second transistor Q2 may be used to sense the current flowing through the load transistor device. Thus, the first transistor Q1 may also be referred to as the load transistor and the second transistor Q2 may also be referred to as the sense transistor. Each of the first transistor Q1 and the second transistor Q2 has a first load node S1, S2, a second load node D1, D2, and a control node G1, G2. The control node G1 of the first transistor Q1 and the control node G2 of the second transistor Q2 are electrically connected so that the first transistor Q1 and the second transistor Q2 have a common control node G. Further, the second load node D1 of the first transistor Q1 and the second load node D2 of the second transistor Q2 are electrically connected so that the first transistor Q1 and the second transistor Q2 have a common second load node D.

According to one example, the first transistor Q1 and the second transistor Q2 are transistors of the same type. Just for the purpose of illustration, each of the first transistor Q1 and the second transistor Q2 is a MOSFET (Metal Oxide Semiconductor Field-Effect Transistor), in particular, an n-type enhancement MOSFET, as shown in FIG. 1. This, however, is only an example. Any other type of MOSFET or any other type of transistor device may be used to implement the first transistor Q1 and the second transistor Q2. When the transistors Q1, Q2 are MOSFETs, as shown in FIG. 1, the control node G1, G2 may also be referred to as the gate node, the first load node S1, S2 may also be referred to as the source node, and the second load node D1, D2 may also referred to as the drain node.

Referring to the above, a transistor arrangement of the type shown in FIG. 1 may be used to supply a current to a load and, at the same time, measure the current supplied to the load. This is illustrated in FIG. 2, which shows one example of an electronic circuit that includes a transistor arrangement of the type shown in FIG. 1 and a load Z.

Figure 2:
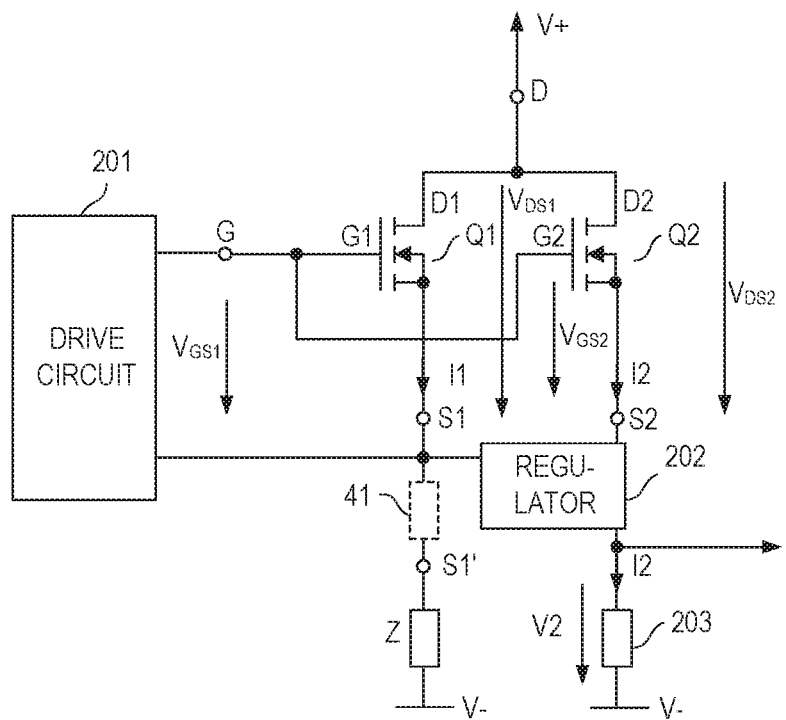
FIG. 2 shows a circuit diagram that illustrates one possible application of a transistor arrangement of the type shown in FIG. 1.

In the electronic circuit shown in FIG. 2, the transistor arrangement is configured to supply a current I1, which may be referred to as load current, to a load Z. For this, a load path of the first transistor Q1, which is a current path between the first load node S1 and the second load node D1, is connected in series with the load Z, wherein the series circuit with the first transistor device Q1 and the load Z is connected between a first supply node and a second supply node. A first supply potential V+ is available at the first supply node and a second supply potential V− different from the first supply potential is available at the second supply node. The first supply potential may be a positive supply potential and the second supply potential may be a negative supply potential or ground potential. A drive circuit 201 is connected to a drive input of the first transistor Q1 and configured to provide a first drive voltage $V_{GS1}$ to the first transistor Q1. The "drive input" of the first transistor Q1 includes the common control node G and the first load node S1 of the first transistor. Based on the drive voltage $V_{GS1}$, the first transistor device Q1 switches on or off. More specifically, the first transistor Q1 switches on, to be in an on-state, when the drive voltage $V_{GS1}$ is higher than a threshold voltage of the first transistor Q1 and switches off, to be in an off-state, when the drive voltage $V_{GS1}$ is lower than the threshold voltage of the first transistor Q1. In the on-state, the first transistor Q1 conducts a current so that a current level of the load current I1 is greater than zero. In the off-state, the first transistor Q1 blocks, so that the current level of the load current I1 is zero.

The transistor arrangement with the load transistor Q1 and the sense transistor Q2 may be used as an electronic switch in any type of application in which it is desired to sense a current provided by an electronic switch to a load. According to one example, the transistor arrangement is part of a self-protected electronic switch that switches off when a current through the electronic switch reaches a predefined threshold, wherein an information on the current is provided by the sense transistor Q2. The load Z may be any type of electric load or electric network. According to one example, the first transistor Q1 and the load Z may be part of a switched-mode voltage converter such as, for example, a buck converter, a boost converter, a flyback converter, or the like.

Referring to FIG. 2, the electronic circuit further includes a regulator 202 that is coupled to the first load node S1 of the first transistor Q1 and the first load node S2 of the second transistor Q2. The regulator 202 is configured to regulate an electrical potential at the first load node S2 of the second transistor device Q2 such that this potential at least approximately equals a potential at the first load node S1 of the first transistor Q1. When the electrical potentials at the first load nodes S1, S2 are equal, the first transistor Q1 and the second transistor Q2 are at the same operating point. That is, the first drive voltage VGS1 received by the first transistor Q1 equals a second drive voltage VGS2 received by the second transistor device Q2; and a load path voltage VDS1 between the second load node D1 and the first load node S1 of the first transistor Q1 equals a second load path voltage VDS2 between the second load node D2 and the first load node S2 of the second transistor Q2. In the following, "common load path voltage VDS" denotes the load path voltage of both transistors Q1, Q2 when the first and second load path voltages VDS1, VDS2 are equal, that is, VDS=VDS1=VDS2. Further, "common drive voltage VGS" denotes the drive voltage of both transistors Q1, Q2 when the first and second drive voltages VGS1, VGS2 are equal, that is, VGS=VGS1=VGS2.

Figure 3:
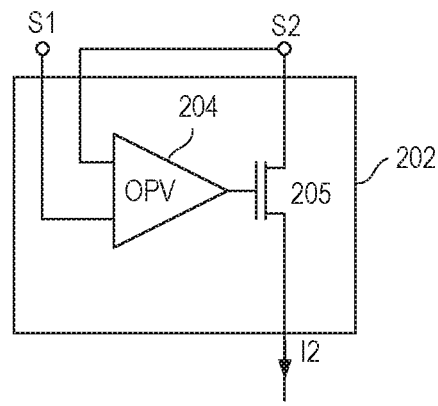
FIG. 3 shows one example of a regulator shown in FIG. 2.

FIG. 3 shows one example of the regulator 202. In this example, the regulator 202 includes an operational amplifier ('OPV') 204 and a variable resistor 205. A first input of the operational amplifier 204 is connected to the first load node S1 of the first transistor device Q1 and a second input of the operational amplifier 204 is connected to the first load node S2 of the second transistor device Q2. The variable resistor 205 is connected in series with the load path of the second transistor device Q2 and controlled by the operational amplifier 204. Just for the purpose of illustration, the variable resistor 205 is a MOSFET in the example shown in FIG. 3. The regulator 202 shown in FIG. 3 is configured to adjust a resistance of the variable resistor 205 such that the electrical potential at the first load node S2 of the second transistor device Q2 essentially equals the electrical potential at the first load node S1 of the first transistor device Q1.

When the second transistor Q2 is operated at the same operating point as the first transistor Q1, a current I2 through the second transistor device Q2 is a representation of the load current I1 through the first transistor device Q1 and the load Z. The second current I2 can therefore be used to measure the load current I1 and will be referred to as the sense current in following. The sense current I2 may be measured in various ways. Just for the purpose of illustration, a resistor 203, which may be referred to as sense resistor is connected in series with the second transistor device Q2. In this example, a voltage V2 across the sense resistor 203 determines the sense current I2.

Referring to FIG. 2, the regulator 202 and the load Z are connected to the first load node S1 of the load transistor Q1. According to one example, the load Z is not directly connected to the first load node S1, but is connected to a further load node S1' which is connected to the first load node S1 via a conductor. This conductor is represented by a resistor 41 in the example shown in FIG. 2. According to one example, the load transistor Q1, the sense transistor Q2, and the regulator 202 are arranged in a common housing (which is not illustrated in FIG. 2). In this case, the further load node S1' is accessible outside the housing and may be referred to as the external load node. In this example, the first load node S1 is not accessible outside the housing and may be referred to as the internal load node.

The first transistor Q1 and the second device Q2 can be designed such that the sense current I2 is much smaller than the load current I1 when both transistors are operated at the same operating point. This may help to minimize losses that are associated with measuring the load current I1. A ratio or proportionality factor between the load current I1 and the sense current I2 may be in a range of between 500 and several $10^4$ (=1E4), such as 5E4 (=50000). This ratio is referred to as current proportionality factor kILIS in the following, that is, $$k\_ILIS = I1/I2 \qquad (1).$$

In an ideal case, the proportionality factor between the load current I1 and the sense current I2 is predefined, and independent of the operating point of the first transistor Q1 and the second transistor Q2, so that in each operating point the load current I1 is given by the sense current I2 multiplied by the predefined and known proportionality factor. The "operating point" is, inter alia, given by the drive voltage VGS, the load path voltage VDS, the load current I1, and the temperature of the transistor arrangement. However, designing the second transistor Q2 such that (a) the sense current I2 is small, and (b) the proportionality factor is great, such as greater than $10^4$, may cause the proportionality factor to vary as the operating point varies. This is explained in the following.

Figure 4:
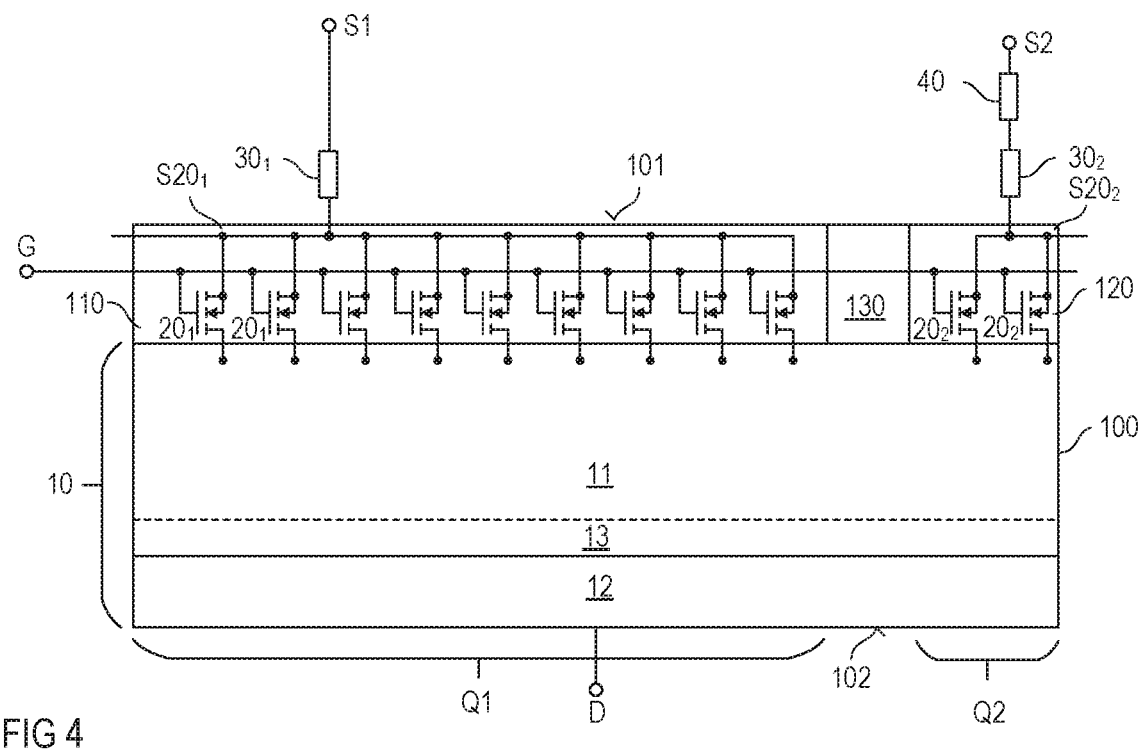
FIG. 4 illustrates how active regions of the load transistor and the sense transistor may be integrated in a semiconductor body.

FIG. 4 schematically illustrates one example of how the transistor arrangement with the first transistor Q1 and the second transistor Q2 can be implemented based on a common semiconductor body 100. FIG. 4 illustrates a vertical cross-sectional view of one section of the semiconductor body 100. In this section, active regions of the first transistor Q1 and the second transistor Q2 are integrated. Just for the purpose of illustration it is assumed that each of the first transistor Q1 and the second transistor Q2 is a MOSFET. Thus, the common second load node D is referred to as common drain node, the common control node G is referred to as common gate node in the following. Further, the first load node S1 of the first transistor Q1 is referred to as first source node and the first load node S2 of the second transistor Q2 is referred to as second source node in the following.

Referring to FIG. 4, the transistor arrangement includes a drift and drain region 10 that is arranged in the semiconductor body 100 and is connected to the common drain node D. At least one load transistor cell $20_1$ is integrated in a first active region 110 (which is briefly referred to as first region in the following) that adjoins the drift and drain region 10, and at least one sense transistor cell $20_2$ is integrated in a second region 120 (which is briefly referred to as second region in the following) that adjoins the drift and drain region 10. According to one example, as illustrated in FIG. 4, a plurality of load transistor cells $20_1$ are integrated in the first region 110, and a plurality of sense transistor cells $20_2$ are integrated in the second region 120. In FIG. 4, the load transistor cells $20_1$ are schematically illustrated by circuit symbols of transistors, and the sense transistor cells $20_2$ are schematically represented by circuit symbols of transistors. Each of the load transistor cells $20_1$ includes a source region integrated in the first region 110, and each of the sense transistor cells $20_2$ includes a source region integrated in the second region 120. In FIG. 4, these source regions are not explicitly shown, but are represented by internal source nodes $S20_1$, $S20_2$ of the circuit symbols representing the load transistor cells $20_1$ and the sense transistor cells $20_2$. The source region $S20_1$ of each of the load transistor cells $20_1$ is electrically connected to the first source node S1 via a first source conductor $30_1$, and the source region $S20_2$ of each of the plurality of sense transistor cells $20_2$ is electrically connected to the second source node S2 via a second source conductor $30_2$. These first and second source conductors $30_1$, $30_2$ have an electrical resistance so that these source conductors $30_1$, $30_2$ are represented by resistors in the example illustrated in FIG. 4.

In the transistor arrangement shown in FIG. 4, the load transistor cells $20_1$ and the first source conductor $30_1$ are part of the load transistor Q1. Further, the sense transistor cells $20_2$ and the second source conductor $30_2$ are part of the sense transistor Q2. The drift and drain region 10 is part of both the load transistor Q1 and the sense transistor Q2.

Referring to FIG. 4, the drift and drain region 10 may include a drift region 11 and a drain region 12. In this case, the drift region 11 adjoins the first region 110 and the second region 120 and is arranged between each of the first region 110 and the second region 120 and the drain region 12. The drift region 11 is more lowly doped than the drain region 12 and may adjoin the drain region 12. Optionally, a field-stop region 13, which is more highly doped than the drift region 11 and more lowly doped than the drain region 12, may be arranged between the drift region 11 and the drain region 12. When the load transistor Q1 (and the sense transistor Q2) is an n-type MOSFET the drain region 12, the drift region 11, and the optional field-stop region 13 are n-doped. When the load transistor Q1 (and the sense transistor Q2) is a p-type MOSFET, the drain region 12, the drift region 11 and the optional field-stop region 13 are p-doped. A doping concentration of the drain region 12 is, for example, in a range of between 1E19 $cm^{-3}$ and 1E21 $cm^{-3}$. A doping concentration of the drift region 13 is, for example, between 1E15 $cm^{-3}$ and 5E17 $cm^{-3}$.

Each of the load transistor Q1 and the sense transistor Q2 has an on-resistance. The on-resistance of the load transistor Q1 is the electrical resistance between the common drain node D and the first source node S1 when the drive voltage $V_{GS1}$ switches on the load transistor Q1, and the on-resistance of the sense transistor Q2 is the electrical resistance between the common drain node D and the second source node S2 when the drive voltage $V_{GS2}$ switches on the sense transistor Q2. In the following, $R_{ON1}$ denotes the on-resistance of the load transistor Q1 and $R_{ON2}$ denotes the on-resistance of the sense transistor Q2.

In accordance with Ohm's law, the load current I1 is given by the quotient of the common load path voltage $V_{DS}$ and the on-resistance $R_{ON1}$ of the load transistor Q1, $$I1 = \frac{V_{DS}}{R_{ON1}}, \qquad (2a)$$

and the sense current I2 is given by the quotient of the common load path voltage $V_{DS}$ and the on-resistance of the sense transistor $R_{ON2}$, $$I2 = \frac{V_{DS}}{R_{ON2}}. \tag{2b}$$

Based on equations (1), (2a) and (2b), the current proportionality factor $k_{ILIS}$ is dependent on the on-resistances $R_{ON1}$, $R_{ON2}$ as follows:

$$k_{ILIS} = \frac{I1}{I2} = \frac{R_{ON2}}{R_{ON1}}. \tag{3}$$

Figure 5:
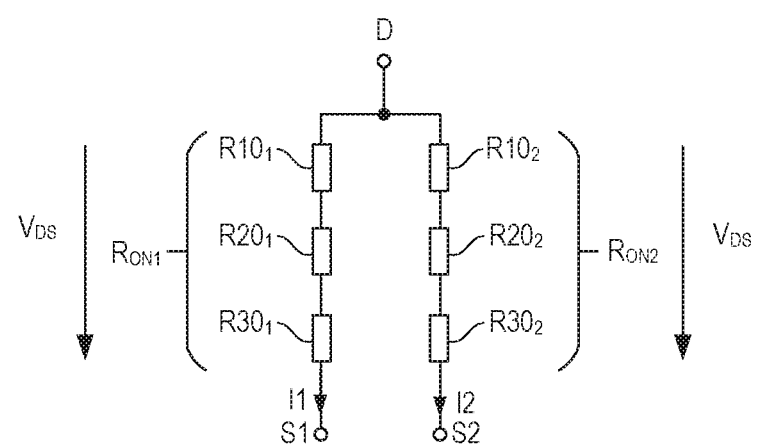
FIG. 5 shows a circuit diagram of the transistor arrangement illustrated in FIG. 4 in an on-state of the transistor arrangement.

Each of these on-resistances $R_{ON1}$, $R_{ON2}$, which are referred to as first and second on-resistances in the following, is comprised of several resistances, wherein each of these resistances is associated with a respective region or structure in the transistor arrangement. This is explained with reference to FIG. 5, which shows the electrical circuit diagram of a transistor arrangement of the type shown in FIG. 4 in the on-state of the transistor arrangement (that is, in the on-state of the load transistor Q1 and the sense transistor Q2). Referring to FIG. 5, the on-resistance $R_{ON1}$ of the load transistor Q1 includes a series circuit with a drift and drain region resistance R10$_1$, a transistor cell resistance R20$_1$, and a source conductor resistance R30$_1$. Equivalently, the on-resistance $R_{ON2}$ of the sense transistor Q2 includes a drift and drain region resistance R10$_2$, a transistor cell resistance R20$_2$, and a source conductor resistance R30$_2$. The source conductor resistance R30$_1$ of the load transistor Q1 is the electrical resistance of the source conductor 30$_1$ between the first source node S1 and the load transistor cells 20$_1$. Equivalently, the source conductor resistance R30$_2$ of the sense transistor Q2 is the electrical resistance of the source conductor 30$_2$ between the second source node S2 and the sense transistor cells 20$_2$. The transistor cell resistance R20$_1$ of the load transistor Q1 is the electrical resistance of the parallel circuit with the plurality of load transistor cells 20$_1$ in the on-state of the load transistor cells 20$_1$. Equivalently, the transistor cell resistance R20$_2$ of the sense transistor cells 20$_2$ is the electrical resistance of the parallel circuit with the plurality of sense transistor cells 20$_2$ in the on-state. The drift and drain region resistance R10$_1$ of the load transistor Q1 is the electrical resistance of the drift and drain region 10 between the drain node D and the parallel circuit with the plurality of load transistor cells 20$_1$ in the first region 110. Equivalently, the drift and drain region resistance R10$_2$ of the sense transistor Q2 is the electrical resistance of the drift and drain region 10 between the drain node D and the parallel circuit with the plurality of sense transistor cells 20$_2$ in the second region 120. Thus, $$R_{ON1} = R10_1 + R20_1 + R30_1 \tag{4a}$$

$$R_{ON2} = R10_2 + R20_2 + R30_2 = k_{ILIS\_10} \cdot R10_1 + k_{ILIS\_20} \cdot R20_1 + k_{ILIS\_30} \cdot R30_1 \tag{4b},$$

where $k_{ILIS\_10}$ denotes a proportionality factor between the drift and drain resistances R10$_2$, R10$_1$ of the sense transistor Q2 and the load transistor Q1, $k_{ILIS\_20}$ denotes a proportionality factor between the transistor cells resistances R20$_2$, R20$_1$ of the sense transistor Q2 and the load transistor Q1, and $k_{ILIS\_30}$ denotes a proportionality factor between the source conductor resistances R30$_2$, R30$_1$ of the sense transistor Q2 and the load transistor Q1.

The drain node D, which is only schematically illustrated in FIGS. 4 and 5, may be formed by a metallization (drain metallization) that adjoins the drain region. Thus, each of the first on-resistance $R_{ON1}$ and the second on-resistance $R_{ON2}$ may additionally include a resistance portion that is formed by the drain metallization. This resistance portion, however, is negligible as compared to the other resistance explained with reference to equations (4a) and (4b) and will therefore not be considered in the following.

Basically, it is desirable that the current proportionality factor kILIS, in the on-state of the transistor arrangement, is independent of an operating state of the transistor arrangement, that is, independent of operating parameters such as magnitude of the drive voltage VGS and temperature of the transistor arrangement. The current proportionality factor kILIS would be widely independent of the operating state if the proportionality factors kILIS_10, kILIS_20, kILIS_30 given in equation (4b) were identical. These proportionality factors kILIS_10, kILIS_20, kILIS_30, however, are usually not identical.

The transistor cell resistance R20$_1$ of the load transistor Q1 is dependent on the operating state of the load transistor Q1 and a size of the load transistor Q1. Equivalently, the transistor cell resistance R20$_2$ of the sense transistor Q2 is dependent on the operating state of the sense transistor Q2 and a size of the sense transistor Q2. The "size" is a parameter of the respective transistor Q1, Q2 that affects the on-resistance such that the on-resistance decreases as the size increases. The load transistor Q1 and the sense transistor Q2 may be implemented such that the proportionality factor $k_{ILIS\_20}$, which may be referred to as cell resistance proportionality factor, is essentially given by $$k_{ILIS\_20} = \frac{R20_2}{R20_1} = \frac{A_1}{A_2}, \tag{5}$$

where A1 is the area of the first region 110 in a horizontal plane parallel to a first surface of the semiconductor body, and A2 is the area of the second region 120 in the horizontal plane. A cell resistance proportionality factor $k_{ILIS\_20}$ in accordance with equation (4b) can be obtained by implementing the load transistor cells 20$_1$ and the sense transistor cells 20$_2$ in the same fashion.

Referring to FIG. 4, an inactive region 130 is arranged between the first active region 110 and the second active region 120. The inactive region 130 does not include active transistor cells so that no current flows in the inactive region 130. However, a current from the load transistor cells 20$_1$ integrated in the first active region 110 and from the sense transistor cells 20$_2$ integrated in the second active region 120 can flow in the drift and drain region 10 below the inactive region 130. Thus, a cross-sectional area of the drift and drain region 10 in which the load current I1 from the load transistor cells 20$_1$ flows through the drift and drain region 10 is greater than the area A1 (in a horizontal section plane parallel to the first surface 101) of the first region 110. Equivalently, a cross-sectional area of the drift and drain region 10 in which the sense current I2 from the sense transistor cells 20$_2$ flows through the drift and drain region 10 is greater than the area A2 of the second region 120. Based on this, the proportionality factor $k_{ILIS\_10}$, which may be referred to as drift and drain resistance proportionality factor, between the drift and drain region resistance R10$_2$ of the sense transistor Q2 and the drift and drain region resistance $R10_1$ of the load transistor Q1 is essentially given by $$k_{ILIS\_10} = \frac{R10_2}{R10_1} = \frac{A1 + \Delta A1}{A2 + \Delta A2}, \quad (6)$$

where $\Delta A1$ denotes the size of a first additional area where the load current I1 may flow below the inactive region. The inactive region may include the inactive region 130 that is shown in FIG. 4 and is arranged between the first region 110 and the second region 120 and other inactive regions (not shown in FIG. 4) that adjoin the first region 110 in lateral (horizontal) directions of the semiconductor body 100. "Lateral directions" are directions parallel to a first surface 101 of the semiconductor body 100. Equivalently, $\Delta A2$ denotes the size of a second additional area of the drift and drain region 10 where the sense current I2 may flow below the inactive region. The inactive region may include the inactive region 130 between the first region 110 and the second region 120 shown in FIG. 4 and other inactive regions adjoining the second region 102 in lateral (horizontal) directions.

The phenomenon that the load current I1 does not only flow through the drift and drain region 10 below the first region 110 and that the sense current I2 does not only flow through the drift and drain region 10 below the second region 120 may be referred to as current spreading.

The size of the first additional area $\Delta A1$ is not linearly dependent on the area A1 of the first region 110, and the size of the second additional area $\Delta A2$ is not linearly dependent on the area A2 of the second region 110. The size of these additional areas $\Delta A1$, $\Delta A2$, inter alia, is dependent on the size of the areas A1, A2, their shape and their positioning relative to an edge of the semiconductor body 100 and relative to each other. (In a first approximation, $\Delta A1$ can be considered to be proportional to a square root of A1, and $\Delta A2$ can be considered to be proportional to the square root of A2). Moreover, it can be shown that a ratio between the size of the additional area ($\Delta A1$, $\Delta A2$ in the example explained above) and the size of the corresponding transistor cell region (110, 120 in the example explained above) increases as the size of the transistor cell region decreases. Based on this and as the size of the first (transistor cell) region 110 may be much greater than the size of the second (transistor) cell region 120, it can be shown that a ratio between the size of the second additional area $\Delta A2$ and the size A2 of the second region 120 is greater than a ratio between the size of the first additional area $\Delta A1$ and the size A1 of the first region 110, that is, $$\frac{\Delta A1}{A1} < \frac{\Delta A2}{A2}. \quad (6)$$

Based on equations (6) it can be shown that $$\frac{\Delta A1 + A1}{\Delta A7 + A2} < \frac{A1}{A2} \rightarrow k_{ILIS\_10} < k_{ILIS\_20} \rightarrow \frac{R10_2}{R10_1} < \frac{R20_2}{R20_1}. \quad (7)$$

The smaller the size A2 of the second region 120 relative to the size A1 of the first region 110 the greater the difference between the drift and drain resistance proportionality factor $k_{ILIS\_10}$ and the cell resistance proportionality factor $k_{ILIS\_20}$.

Basically, the current proportionality factor $k_{ILIS}$ as given in equation (3) could be obtained based on driving the transistor arrangement in the on-state and measuring the load transistor on-resistance $R_{ON1}$ and the sense transistor on-resistance $R_{ON2}$. The current proportionality factor $k_{ILIS}$ obtained based on one transistor arrangement is then valid for a plurality of transistor arrangements produced based on the same manufacturing process. However, due to the dependency of the cell resistances $R20_1$. $R20_2$ on the drive voltage $V_{GS}$ the current proportionality factor obtained in this way is dependent on the drive voltage $V_{GS}$. Further, the cell resistances $R20_1$, $R20_2$ and the drift and drain resistances $R10_1$, $R10_2$ are temperature dependent and usually have different temperature coefficients. Thus, even when the transistor arrangement is operated in the same operating point, the current proportionality factor $k_{ILIS}$ may vary as the temperature varies. Besides the drift and drain resistance proportionality factor $k_{ILIS\_10}$ the source conductor resistance proportionality factor $k_{ILIS\_30}$ may deviate from the cell resistance proportionality factor $k_{ILIS\_20}$. The source conductor resistances $R30_1$, $R30_2$, however, may be implemented such that the) are significantly lower than the corresponding drift and drain resistances $R10_1$, $R10_2$ so that the temperature variation of the current proportionality factor $k_{ILIS}$ is mainly caused by the deviation of the drift and drain resistance proportionality factor $k_{ILIS\_10}$ from the cell resistance proportionality factor $k_{ILIS\_20}$.

It is therefore desirable to implement the transistor arrangement such that the current proportionality factor $k_{ILIS}$ is widely independent on the temperature within a given temperature range. This temperature range ranges from $-40°$ C. (degree centigrade) to $150°$ C., for example.

Figure 6:
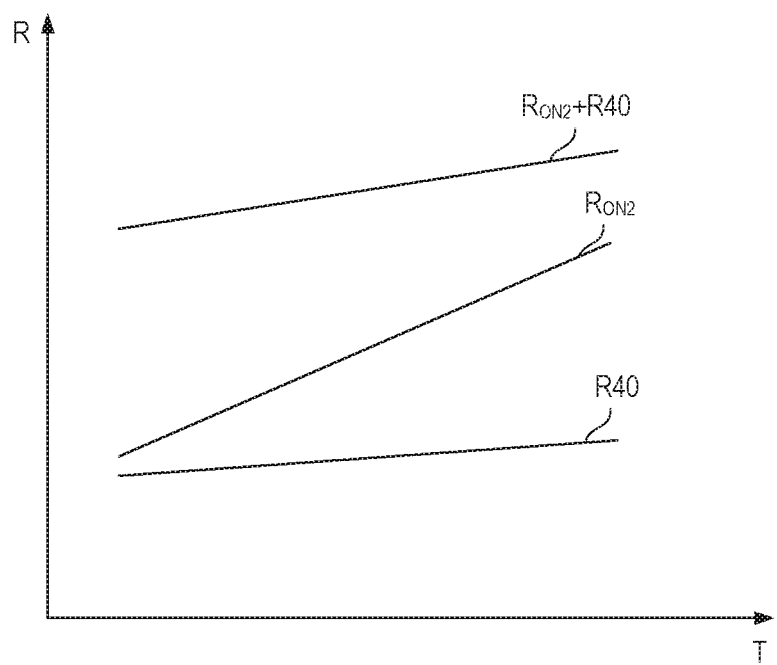
FIG. 6 schematically illustrates temperature dependencies of on-resistances of the load transistor, the sense transistor, and a compensation resistor.
Figure 6:
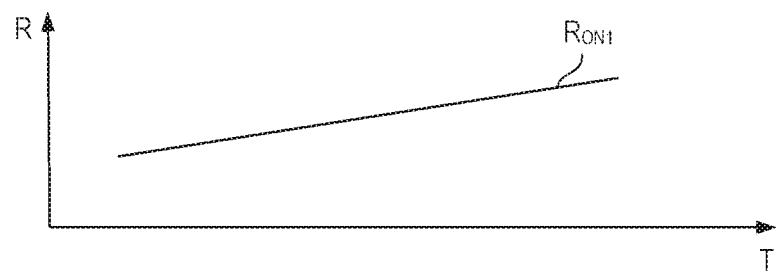

This is achieved by providing a further resistor 40 in series with the second source conductor $30_2$. This further resistor 40, which is also referred to as compensation resistor in the following, is integrated in the semiconductor body 100 so that the compensation resistor 40 and the drift and drain region 10, which forms the drift and drain resistances $R10_1$, $R10_2$, essentially have the same temperature. The compensation resistor 40 has a resistance R40. FIG. 6 illustrates one example of how this resistance R40 may be selected.

FIG. 6 schematically illustrates the on-resistance $R_{ON1}$ of the load transistor Q1, the on-resistance $R_{ON2}$ of the sense transistor Q2, and the resistance R40 of the compensation resistor 40. Referring to the above, the on-resistance $R_{ON2}$ of the sense transistor Q2 can be several thousand times the on-resistance $R_{ON1}$ of the load transistor Q1. Thus, these resistances $R_{ON1}$, $R_{ON2}$ are illustrated in different scales and therefore different plots in FIG. 6. Each of these resistances $R_{ON1}$, $R_{ON2}$ is dependent on the temperature T. According to a first approximation these resistances $R_{ON1}$, $R_{ON2}$ are linearly dependent on the temperature such that $$R_{ON1}(T1) = R_{ON1}(T0) \cdot (1 + TC_{ON1} \cdot (T1 - T0)) \quad (8a)$$

$$R_2(T1) = R_{ON2}(T0) \cdot (1 + TC_{ON2} \cdot (T1 - T0)) \quad (8a)$$

where $R_{ON1}(T0)$ and $R_{ON1}(T1)$ denote the on-resistance $R_{ON1}$ of the load transistor Q1 at a first temperature T0 and a second temperature T1, respectively, $R_{ON2}(T0)$ and $R_{ON2}(T1)$ denote the on-resistance $R_{ON2}$ of the sense transistor Q2 at the first temperature T0 and the second temperature T1, respectively, $TC_{ON1}$ denotes the temperature coefficient of the on-resistance $R_{ON1}$ of the load transistor Q1, and $TC_{ON2}$ denotes the temperature coefficient of the on-resistance $R_{ON2}$ of the sense transistor Q1. These temperature coefficients $TC_{ON1}$, $TC_{ON2}$ are referred to as first temperature coefficient $TC_{ON1}$ and second temperature coefficient $TC_{ON2}$ in the following. The temperature coefficients $TC_{ON1}$, $TC_{ON2}$ are given by $$TC_{ON1} = \frac{dR_{ON1}(T)}{dT \times R_{ON1}(T0)} \quad (9a)$$

$$TC_{ON2} = \frac{dR_{ON2}(T)}{dT \times R_{ON2}(T0)}, \quad (9b)$$

where $dR_{ON1}(T)$ and $dR_{ON2}(T)$ are changes of the on-resistances $R_{ON1}$, $R_{ON2}$ at a temperature change of $dT$, and where $R_{ON1}(T0)$, $R_{ON2}(T0)$ are the on-resistances at the first temperature.

Curves as illustrated in FIG. 6 can be obtained by measuring the on-resistances $R_{ON1}$, $R_{ON2}$ over a certain temperature range using a sample transistor arrangement or by obtaining the on-resistances $R_{ON1}$, $R_{ON2}$ from a computer simulation of the transistor arrangement The first and second temperature coefficient $TC_{ON1}$, $TC_{ON2}$ can be obtained from these curves.

Referring to equations (4a) and (4b) each of the first and second on-resistances $R_{ON1}$, $R_{ON2}$ includes a respective source conductor resistance $R30_1$, $R30_2$, a respective cell region resistance $R20_1$, $R20_2$, and a respective drift and drain region resistance $R10_1$, $R10_2$. Each of these resistances is temperature dependent. Moreover, the drift and drain resistances $R10_1$, $R10_2$ may have different temperature coefficients, the cell resistances $R20_1$, $R20_2$ may have different temperature coefficients, and the source conductor resistances $R30_1$, $R30_2$ may have different temperature coefficients. Basically, however, temperature coefficients of the cell resistances $R20_1$, $R20_2$ are higher than the temperature coefficients of the source conductor resistances $R10_1$, $R10_2$, and the source conductor resistance temperature coefficients are higher than the temperature coefficients of the drift and drain resistances $R10_1$, $R10_2$. Referring to the above, the drift and drain resistance proportionality factor $k_{ILIS10}$ may significantly deviate from the cell resistance proportionality factor $k_{ILIS20}$. In connection with equation (10) this may have the effect that, as illustrated in FIG. 6, the first temperature coefficient $TC_{ON1}$ is lower than the second temperature coefficient $TC_{ON2}$.

According to one example, a deviation of the temperature coefficient $TC_{ON2}$ of the sense transistor on-resistance $R_{ON2}$ from the temperature coefficient $TC_{ON1}$ of the load transistor on-resistance $R_{ON1}$ can be compensated by implementing the compensation resistor 40 such that its temperature coefficient $TC_{40}$ is lower than the temperature coefficient $TC_{ON1}$ of the load transistor on-resistance $R_{ON1}$. The resistance R40 of a compensation resistor 40 of this type is also illustrated in FIG. 6. According to one example, a magnitude and the temperature coefficient of the compensation resistor 40 are selected such that a temperature coefficient $TC_{ON2\_40}$ of an overall on-resistance $R_{ON2}+R40$ that includes the on-resistance $R_{ON2}$ of the sense transistor Q2 and the compensation resistance R40 essentially equals the temperature coefficient $TC_{ON1}$ of the load transistor on-resistance $R_{ON1}$, that is, $TC_{ON2\_40} \approx TC_{ON1}$. The temperature coefficient $TC_{ON2\_40}$ of the overall on-resistance $R_{ON2\_40}=R_{ON2}+R40$ in a temperature range around a certain temperature T0 is essentially given by $$TC_{ON2\_40} = \frac{dR_{ON2\_40}(T)}{dT \times R_{ON2\_40}(T0)} = \frac{dR_{ON2}(T) + dR40(T)}{dT \times (R_{ON2}(T0) + R40(T0))}, \quad (10a)$$

where $dR40(T)$ denotes the change of the compensation resistance dependent on the temperature change $dT$, $R40(T0)$ denotes the compensation resistance R40 at the certain temperature T0, $dR_{ON2}(T)$ denotes the change of the sense transistor on-resistance $R_{ON2}$ dependent on the temperature change $dT$, and $R_{ON2}(T0)$ denotes the sense transistor on-resistance $R_{ON2}$ at the certain temperature T0. Based on equation (11) it can be seen that the temperature coefficient $TC_{ON2\_40}$ of the overall sense transistor on-resistance $R_{ON2\_TOT}=R_{ON2}+R40$ can be adjusted by suitably adjusting the magnitude and/or the temperature coefficient of the compensation resistor R40.

According to one example, the temperature coefficient $$TC_{40} = \frac{dR40(T)}{dT}$$

of the resistance R40 of the compensation resistor 40 is essentially zero ($TC_{40} \approx 0$) so that the resistance R40 is widely independent of the temperature T. In this case, the temperature coefficient $TC_{ON2\_40}$ of the overall on-resistance $R_{ON2\_40}$ can be adjusted based on the magnitude of the resistance R40, only, wherein equation (10a) can be simplified as follows:

$$TC_{ON2\_40} = \frac{dR_{ON2\_40}(T)}{dT \times R_{ON2\_40}(T0)} = \frac{dR_{ON2}(T)}{dT \times (R_{ON2}(T0) + R40)}, \quad (10b)$$

where R40 denotes the temperature independent resistance of the compensation resistor 40.

Having implemented the compensation resistor 40 such that the temperature coefficient $TC_{ON2\_40}$ of the overall sense transistor on-resistance $R_{ON2\_TOT}=R_{ON2}+R40$ essentially equals the temperature coefficient $TC_{ON1}$ of the load transistor on-resistance $R_{ON1}$ a the temperature independent current proportionality factor $k_{ILIS\_IND}$ of the transistor arrangement is given by $$k_{ILIS\_IND} = \frac{R_{ON2}(T0) + R40(T0)}{R_{ON1}(T0)}, \quad (11)$$

where T0 denotes any temperature in the temperature range in which equations (8a), (8b) and (11) apply. T0 is 25° C. for example.

Adjusting the compensation resistance R40 is explained with reference to two different examples in the following.

Example 1

$R_{ON1}(25°\ \text{C.})=3.74\text{E-}4\Omega$, $TC_{ON1}=0.283\%$ between $-40°$ C. and 25° C.

$R_{ON2}(25°\ \text{C.})=20.52\Omega$, $TC_{ON2}=0.323\%$ between $-40°$ C. and 25° C.

$R_{40}(25°\ \text{C.})=3.25\Omega$, $T_{40}=0.0097\%$ between $-40°$ C. and 25° C.

In this example, the current proportionality factor $k_{ILIS}$ without compensation resistor varies about 3% in the temperature range of between −40° C. and 25° while the variation of the current proportionality factor $k_{ILIS\_IND}$ when the compensation resistance R40 is added is less than 0.8%.

Example 2

$R_{ON1}$(25° C.)=3.74E-4Ω, $TC_{ON1}$=0.421% between 25° C. and 150° C.
$R_{ON2}$(25° C.)=20.52Ω, $TC_{ON2=0.461}$% between 25° C. and 150° C.
$R_{40}$(25° C.)=3.25Ω, $T_{40}$=0.0097% between 25° C. and 150° C.

In this example, the current proportionality factor $k_{ILIS}$ without compensation resistor varies about 3% in the temperature range of between 25° C. and 150° C. while the variation of the current proportionality factor $k_{ILIS\_IND}$ when the compensation resistance R40 is added is less than 0.8%.

Based on examples 1 and 2 it can be seen that one and the same compensation resistor 40 may be used to compensate temperature variations of the current proportionality factor $k_{ILIS}$ in two different temperature ranges in which the on-resistances $R_{ON1}$, $R_{ON2}$ have different temperature coefficients.

Based on equation (4a) it can be seen that the first on-resistance $R_{ON1}$ of the load transistor Q1 includes a first internal resistance portion $R_{INT1}$, which may also be referred to as first semiconductor resistance, and a first external resistance portion $R_{EXT1}$, which may also be referred to as first wiring portion. The first internal portion $R_{INT1}$ includes the drift and drain region resistance $R10_1$ and the transistor cell resistance $R20_1$ of the load transistor Q1, $$R_{INT1}=R10_1+R20_1 \quad (12a),$$

and the first external portion $R_{EXT1}$ includes the source conductor resistance $R30_1$, $$R_{EXT1}=R30_1 \quad (12b).$$

Thus, the first internal resistance $R_{INT1}$ is a portion of the first on-resistance $R_{ON1}$ resulting from active regions of the load transistor Q1 inside the semiconductor body 100. These active regions are located inside the semiconductor body 100 between the drain node D and the source conductor 30$_1$ and include a portion of the drift and drain region 10 and the at least one transistor cell 20$_1$ of the load transistor Q1. The first external resistance $R_{EXT1}$ is a portion of the first on-resistance $R_{ON1}$ resulting from a wiring arrangement between the at least one transistor cell 20$_1$ and the first source node S1. This wiring arrangement may be located inside or outside the semiconductor body.

Equivalently, the overall sense transistor on-resistance $R_{ON2\_TOT}$ of the sense transistor Q2 includes a second internal resistance portion $R_{INT2}$ (semiconductor portion) and a second external resistance portion $R_{EXT2}$ (wiring portion), wherein the first internal portion $R_{INT2}$ includes the drift and drain region resistance $R10_2$ and the transistor cell resistance $R20_2$ of the sense transistor Q2, $$R_{INT2}=R10_2+R20_2 \quad (13a),$$

and wherein the second external portion $R_{EXT2}$ includes the source conductor resistance $R30_1$ and the compensation resistance R40, $$R_{EXT2}=R30_2+R40 \quad (13b).$$

Thus, the second internal resistance $R_{INT2}$ is a portion of the second on-resistance $R_{ON2}$ resulting from active regions of the sense transistor Q2 inside the semiconductor body 100. These active regions are located inside the semiconductor body 100 between the drain node D and the source conductor 30$_2$ and include a portion of the drift and drain region 10 and the at least one transistor cell 20$_2$ of the sense transistor Q2. The second external resistance $R_{EXT2}$ is a portion of the second on-resistance $R_{ON2}$ resulting from a wiring arrangement between the at least one transistor cell 20$_2$ of the sense transistor Q2 and the second source node S2. This wiring arrangement includes the source conductor 30$_2$ and the compensation resistor 40, wherein at least the compensation resistor 40 is arranged inside the semiconductor body 100.

It can be shown that in order to compensate for the current spreading effect explained above an external resistance ratio $R_{EXT2}$:$R_{EXT1}$ between the second external resistance $R_{EXT2}$ and the first external resistance $R_{EXT1}$ is different from an internal resistance ratio $R_{INT2}$:$R_{INT1}$ between the second internal resistance $R_{INT2}$ and the first internal resistance $R_{INT1}$. The external resistance ratio $R_{EXT2}$:$R_{EXT1}$ is also referred to as first ratio RT1 in the following, and the internal resistance ratio $R_{INT2}$:$R_{INT1}$ is also referred to as second ratio RT2 in the following.

According to one example, the external resistance ratio $R_{EXT2}$:$R_{EXT1}$ (the first ratio RT1) is greater than the internal resistance ratio $R_{INT2}$:$R_{INT1}$ (the second ratio RT2), $$\frac{R_{EXT2}}{R_{EXT1}} > \frac{R_{INT2}}{R_{INT1}}. \quad (14)$$

This, however, is only an example. Dependent on the internal resistances $R_{INT1}$, $R_{INT2}$ and the source conductor resistances $R30_1$, $R30_2$ it is also possible that the compensation resistor 40 is implemented such that the first ratio RT1 is smaller than the second ratio RT2, in order to achieve that the current proportionality factor $k_{ILIS\_IND}$ is essentially constant over a predefined temperature range.

According to one example, the larger one (the maximum) of the first and second ratios RT1, RT2 may be at least 105% of the smaller one (the minimum) of the first and second ratios RT1, RT2, that is, $$\max(RT1,RT2) \geq 1.05 \cdot \min(RT1,RT2) \quad (15),$$

where max(RT1, RT2) denotes the larger one of the first and second ratios RT1, RT2 and min(RT1, RT2) denotes the smaller one of the first and second ratios RT1, RT2. For example, the larger one of the first and second ratios RT1, RT2 may be between 105% and 250% of the smaller one of the first and second ratios RT1, RT2, that is, $$1.05 \cdot \min(RT1,RT2) \leq \max(RT1,RT2) \leq 2.5 \cdot \min(RT1,RT2) \quad (16).$$

Figure 7A:
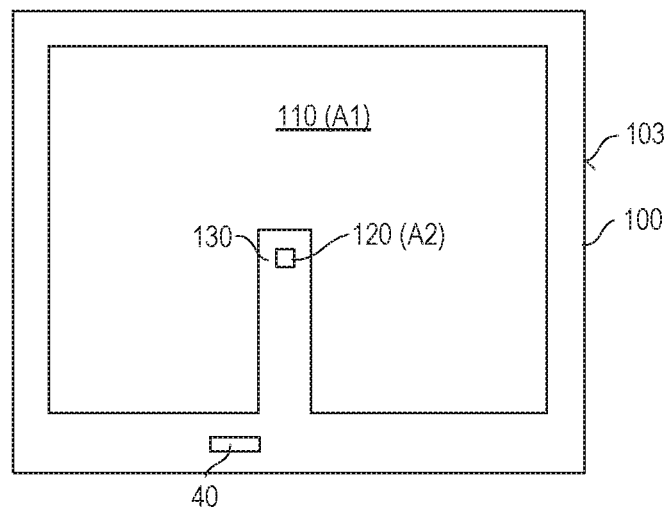
FIGS. 7A to 7C show different horizontal cross-sectional views that illustrate where a first active region with load transistor cells, a second active region with sense transistor, and a compensation resistor may be arranged in a semiconductor body.

Referring to FIG. 7A, the compensation resistor 40 may be integrated in the inactive region 130. More specifically, the compensation resistor 40 may be integrated in the inactive region 130 in an edge region of the semiconductor body 100. The "edge region" is a region located between the first and second active regions 110, 120 and an edge surface 103 of the semiconductor body 100. The "edge surface 103" terminates the semiconductor body 100 in lateral directions, which are directions parallel to the first surface 101 and the opposite second surface 102 illustrated in FIG. 4.

Arranging the first and second active regions 110, 120 and the compensation resistor 40 in the way illustrated in FIG. 7A is only one example. According to further examples shown in FIGS. 7B and 7C, the second region 120 may be arranged in a corner of the first region 110 (see FIG. 7B) or may be arranged in a region of an outer edge of the first region 110 (see FIG. 7C). In each of these examples, the compensation resistor 40 may be located in the edge region of the semiconductor body 100.

Figure 7B:
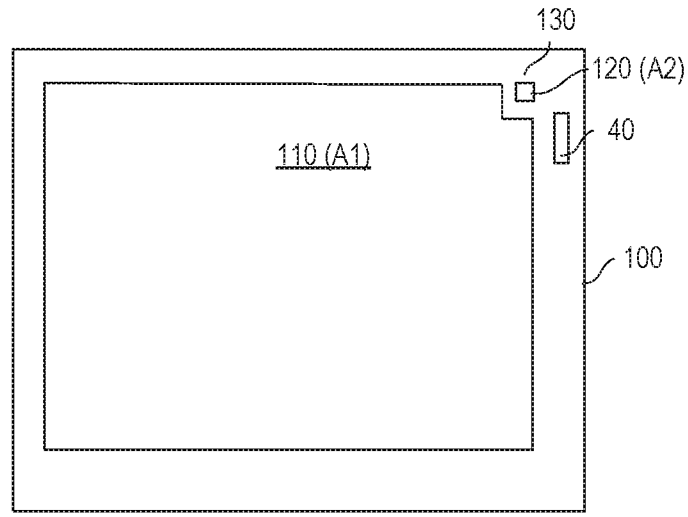
Figure 7C:
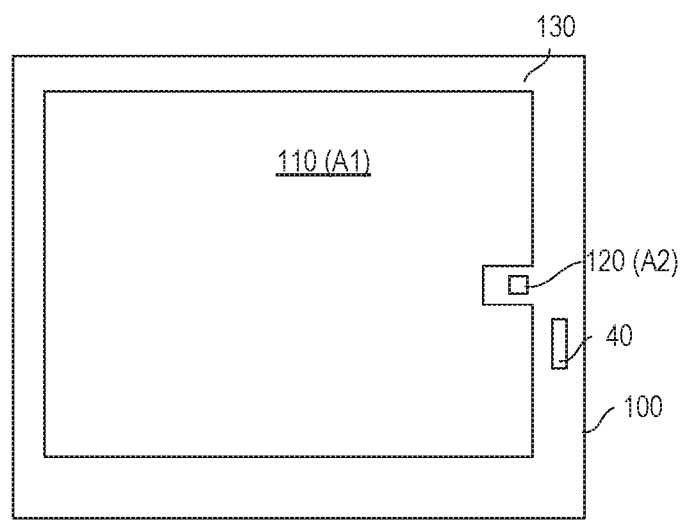

It should be noted that FIGS. 7A-7C merely illustrate positions of the first and second active regions 110, 120 and the compensation resistor 40 in the semiconductor body. Connections between individual parts of the transistor arrangement, such as connections between the at least one sense transistor cell integrated in the second active region 120 and the compensation resistor 40 are not illustrated. Such connections are explained herein further below.

In FIGS. 7A-7C, A1 denotes the first area of the first active region and A2 denotes the second area of the second active region. According to one example, the first area A1 is between 1.5 mm² and 3 mm² and the second area A2 is between 1/500 (=1/5E2) and 1/1E6 times the first area A1, in particular between 1/1E3 and 1/1E5 times the first area. In this case the cell resistance proportionality factor $k_{ILIS\_20}$ is between about 500 and 1E6 (1000000), in particular between about 1E3 and 1E5.

It should be mentioned that it is also possible to implement two sense transistors in the transistor arrangement that have different sizes, wherein a respective compensation resistor may be connected in series with each of these sense transistors. The size (area) of a first one of these sense transistors is, for example, between 5E3 times and 2E4 times the size of the load transistor, and the size (area) of a second one of these sense transistors is, for example, between 2E4 times and 1E5 times the size of the load transistor Q1^.

Figures 8A, 8B:
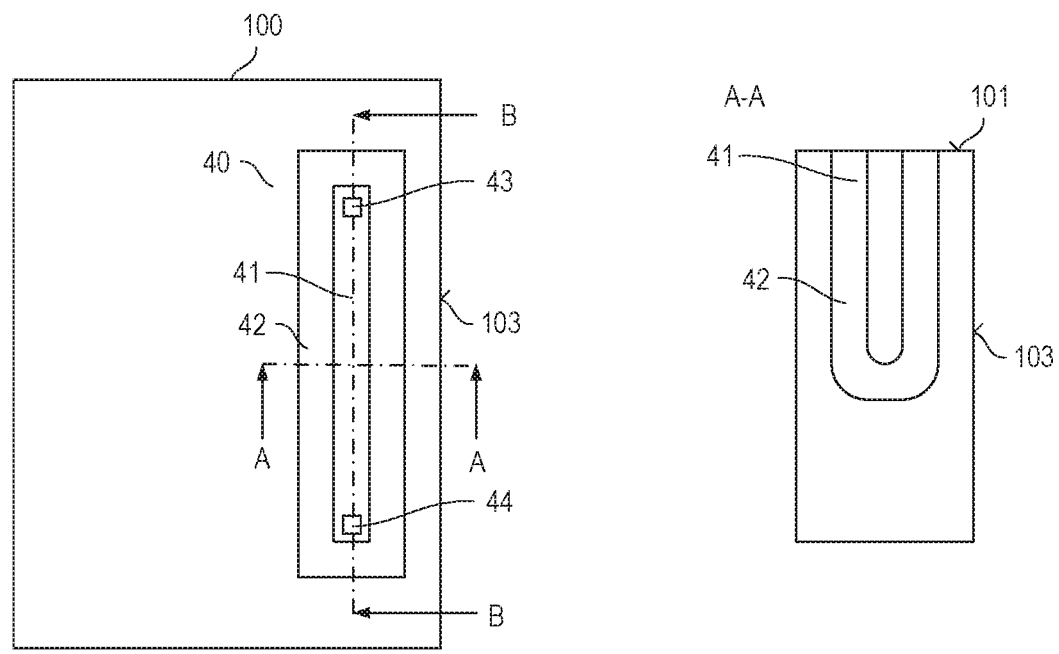
FIGS. 8A to 8C illustrate one example of the compensation resistor.
Figure 8C:
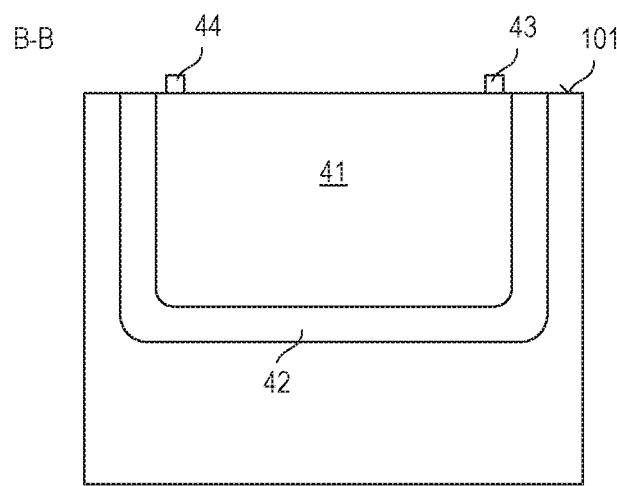

FIGS. 8A-8C illustrate one example of the compensation resistor 40, wherein FIG. 8A shows a top view of one section of the semiconductor body 100 in which the compensation resistor 40 is integrated, FIG. 8B shows a vertical cross-sectional view of the compensation resistor 40 in a first section plane A-A, and FIG. 8C shows a vertical cross-sectional view of the compensation resistor 40 in a second section plane B-B. In this example, the compensation resistor 40 includes a resistive conductor 41 that is arranged in a trench that extends from the first surface 101 into the semiconductor body 100. The resistive conductor 41 is dielectrically insulated from the semiconductor body 100 by a dielectric layer 42, such as an oxide. The resistive conductor 41 is elongated and may be contacted via a first contact 43 at a first lateral end and a second contact 44 at a second lateral end. The resistance of the compensation resistor 40 is given by the resistance of the resistive conductor 41 between the first contact 43 and the second contact 44. This resistance can be adjusted by suitably selecting the geometry of the resistive conductor 41 and by suitably selecting its specific resistance. In general, the resistance of the resistive conductor 41 can be increased (decreased), at a given material of the resistive conductor 41, by increasing (decreasing) a distance between the first and second contact 43, 44. Further, the resistance of the resistive conductor 41 can be decreased (increased) by increasing (decreasing) a cross-sectional area of the resistive conductor 41 in a plane that is essentially perpendicular to a current flow direction in the resistive conductor 41.

FIGS. 8A-8C schematically illustrate one example of the compensation resistor, wherein these figures only illustrate aspects that are relevant for implementing the compensation resistors. Other structural elements, such as passivation layers covering the trench with the resistive conductor 41 are not shown.

According to one example, the resistive conductor 41 includes a doped polycrystalline semiconductor material such as polysilicon. The temperature coefficient of such doped polycrystalline semiconductor material can be adjusted by suitably adjusting an n-type or p-type doping concentration. According to one example, the doping concentration is selected from between 5E18 cm⁻³ and 5E20 cm⁻³, in particular between 1E19 cm⁻³ and 5E19 cm⁻³. At a doping concentration of about 2.5E19 cm⁻³, for example, the temperature coefficient is almost 0. According to one example, the compensation resistor 40 includes several resistive conductors of the type shown in FIGS. 8A to 8C connected in parallel. Referring to examples 1 and 2, the compensation resistance R40 may be 3.25Ω. Based on a resistive conductor 41 of the type shown in FIGS. 8A to 8C, such compensation resistance may be obtained by connecting 45 resistive conductors 41 in parallel each having a length of 7 micrometers and a cross section of 0.28 µm×1.7 µm and each having a resistance of about 147Ω (3.25Ω≈147Ω/45). Based on this example it can be seen that various kinds of modifications are possible in order to vary the resistance R40 as desired.

Of course, it is also possible to connect several structures of the type illustrated in FIGS. 8A-8C in series to form the compensation resistor 40.

Figure 9:
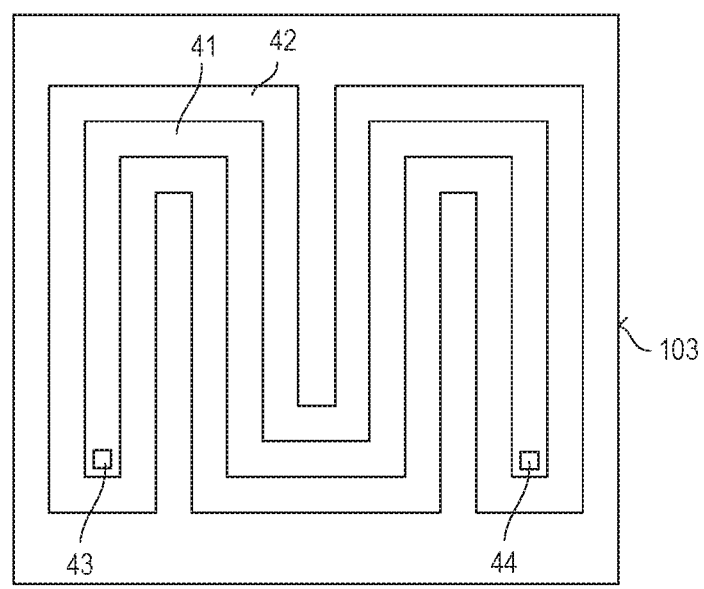
FIG. 9 illustrates another example of the compensation resistor.

FIG. 9 shows a top view of a compensation resistor 40 according to another example. In this example, the trench with the resistive conductor 41 and the dielectric layer 42 is meandering so that the resistive conductor 41 is meandering.

Figure 10:
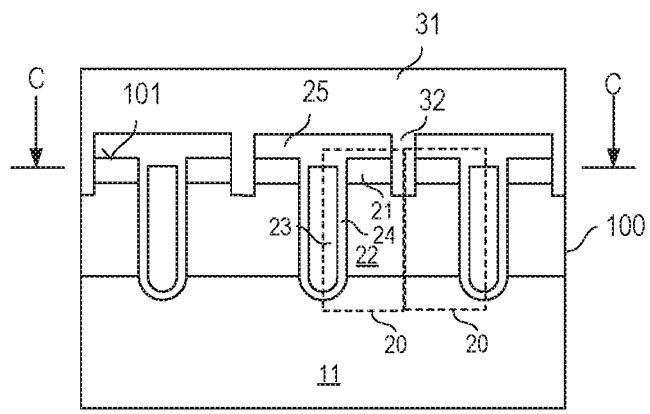
FIG. 10 illustrates a vertical cross-sectional view of transistor cells according to one example that may be implemented in the load transistor and/or the sense transistor.
Figure 13:
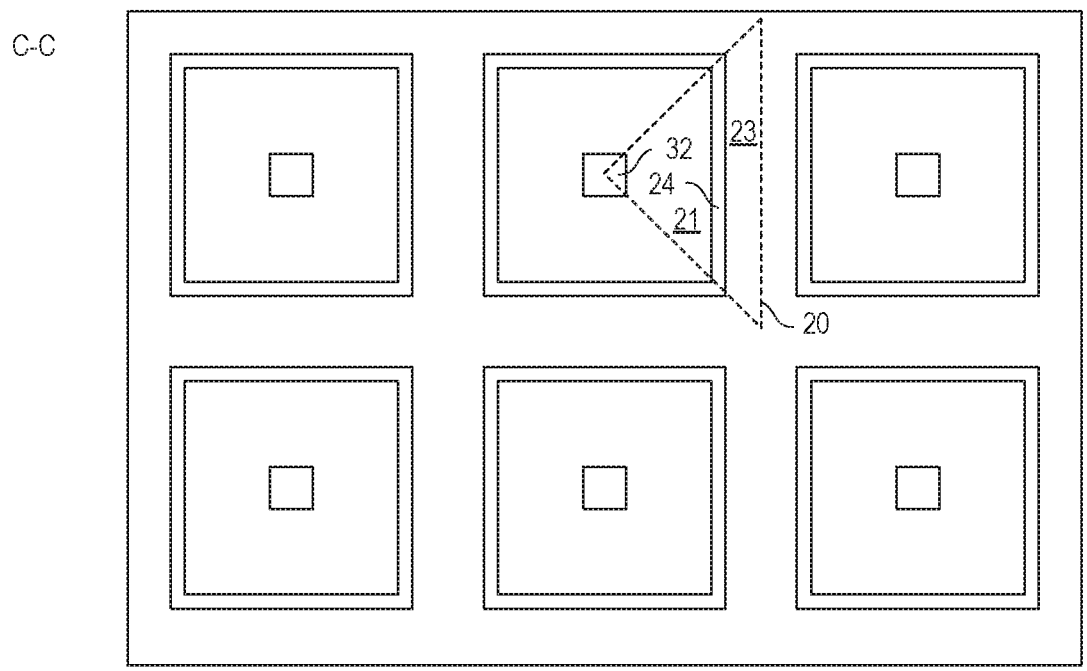
FIG. 13 shows another example of a horizontal cross-sectional view of the transistor cells shown in FIG. 9 or 10.

FIG. 10 schematically illustrates a cross-sectional view of several transistor cells of the transistor arrangement. Transistor cells of the type illustrated in FIG. 10 may be used to implement the load transistor cells 20₁ and the sense transistor cells 20₂. Thus, reference character 20 in FIG. 13 represents an arbitrary one of the load transistor cells 20₁ or sense transistor cells 20₂. Referring to FIG. 10, each transistor cell 20 includes a body region 22 adjoining the drift and drain region 10. More specifically, the body region 22 adjoins the drift region 11, and the body region 22 separates the drift region 11 from a source region 21. Further, a gate electrode 23 is arranged adjacent the body region 22 and is dielectrically insulated from the body region 22 by a gate dielectric 24. In a conventional fashion, the gate electrode 23 serves to control a conducting channel in the body region 22 between the source region 21 and the drift region 11. The source region 21 and the body region 22 of the transistor cell 20 are electrically connected to a metallization 31 that forms a part of the source conductor. The metallization 31 shown in FIG. 13 is part of the first source conductor 30₁ when the transistor cells 20 are load transistor cell 20₁, and the metallization 31 is part of the second source conductor 30₂ when the transistor cell 20 are sense transistor cells 20₂.

In the example shown in FIG. 10, the metallization 31 is electrically connected to the source regions 21 and the body regions 22 via contact plugs 32. These contact plugs 32 are electrically (ohmically) connected to the source regions 21 and the body regions 22. Further, the metallization 31 is electrically insulated from the gate electrodes 23 by an insulation layer 25. The gate electrodes 23 are electrically connected to the common gate node G in a manner not illustrated in FIG. 10.

Figure 11:
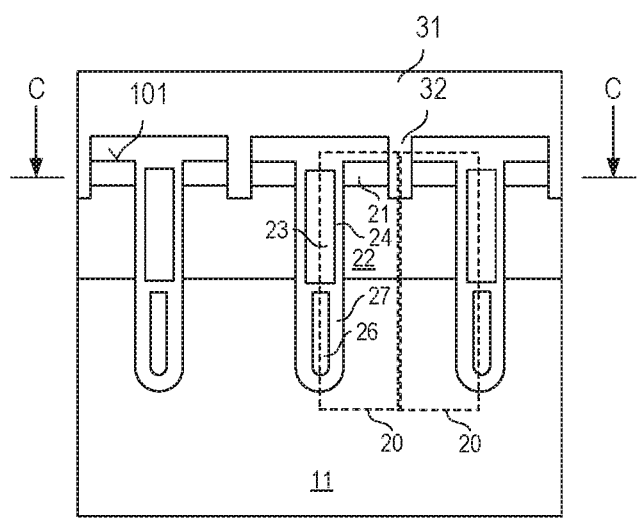
FIG. 11 illustrates a vertical cross-sectional view of transistor cells according to another example that may be implemented in the load transistor and/or the sense transistor.

In a n-type MOSFET, the source regions 21 are n-type regions and the body regions 22 are p-type regions. In a p-type MOSFET, the source regions 21 are p-type regions and the body regions 22 are n-type regions FIG. 11 shows a modification of the transistor cells 20 shown in FIG. 13. The transistor cells 20 according to FIG. 11 each additionally include a field electrode 26 and a field electrode dielectric 27 that dielectrically insulates the field electrode 26 from the drift region 11. According to one example, the field electrode 26 is electrically connected to the source metallization 31 in a vertical plane different from the vertical plane shown in FIG. 11. This connection, however, is not explicitly illustrated in FIG. 11. According to another example (not shown) the field electrode 26 is connected to the gate electrode 23. The latter may be achieved by forming one electrode that forms the gate electrode 23 and the field electrode 26.

The transistor cells 20 illustrated in FIGS. 9 and 10 are trench transistor cells. That is, the gate electrode 23 of each transistor cell 20 is arranged in a trench that extends from the first surface 101 of the semiconductor body 100 into the semiconductor body 100. Implementing the transistor cells 20 as trench transistor cells, however, is only one example. According to another example (not shown), the transistor cells 20 are implemented as planar transistor cells. In a "planar transistor cell" the gate electrode is arranged on top of the surface of the semiconductor body.

Figure 12:
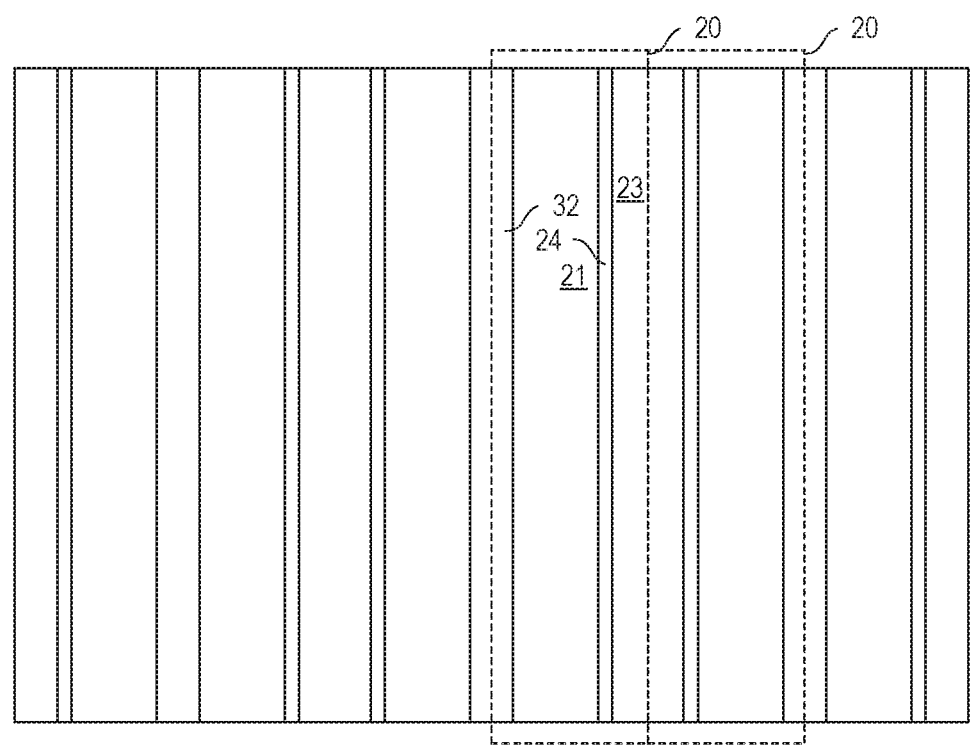
FIG. 12 shows one example of a horizontal cross-sectional view of the transistor cells shown in FIG. 9 or 10.

FIG. 12 shows a horizontal cross-sectional view of the transistor cells shown in FIGS. 9 and 10 according to one example. In this example, the transistor cells are elongated transistor cells (stripe cells). That is, the gate electrodes 23, the source regions 21 and the body regions 22 are elongated in a horizontal direction of the semiconductor body 100. The "horizontal direction" is a direction parallel to the first surface 101.

FIG. 13 shows a horizontal cross-sectional view of the transistor cells 20 according to another example. In this example, the gate electrode 23 has the shape of a rectangular grid that surrounds rectangular body regions (out of view in FIG. 15). The source region 21 has the form of a rectangular ring in this example. The individual transistor cells 20 can be considered as triangular transistor cells in this example. Implementing the gate electrode as a rectangular grid is only one example. A grid shaped gate electrode 23 may be implemented with other geometries, such as a hexagon, a pentagon, or the like. The grid shaped electrode is connected to the common gate node G and may form the gate electrode of each of the load transistor cells $20_1$ and the sense transistor cells $20_2$.

When implementing the transistor cells $20_1$ of the load transistor Q1 and the transistor cells $20_2$ in the same fashion, of the cell resistances $R20_2$, $R20_1$ is essentially given by the ratio A1/A2 between the first area and the second area. In this case, the proportionality factor $k_{ILIS\_20}$ is also given by a ratio L1/L2, wherein L1 is an overall channel width of the load transistor cells $20_1$ and L2 is an overall channel width of the sense transistor cells $20_2$.

Figure 14:
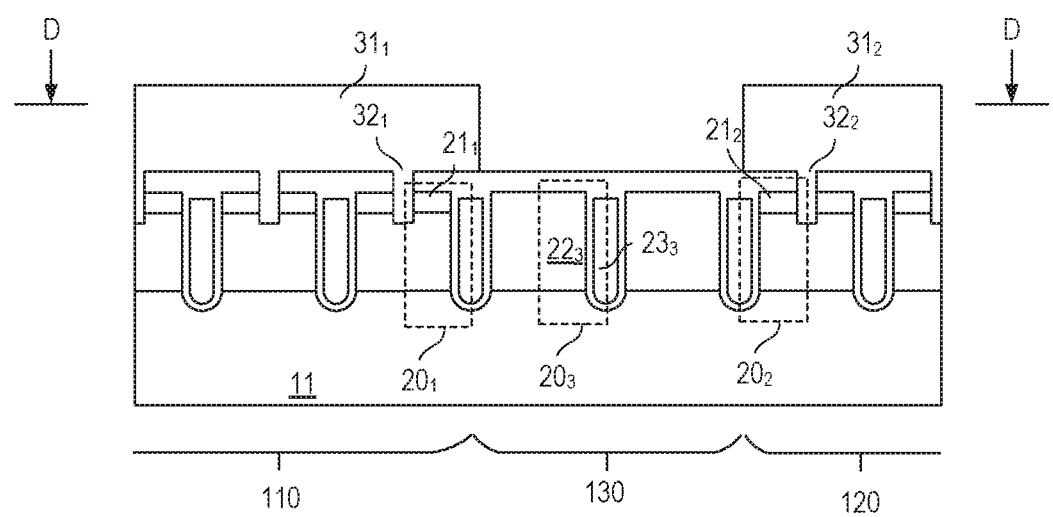
FIG. 14 shows one example of how an inactive region between the first active region and the second active region may be implemented.

FIG. 14 shows a vertical cross-sectional view of the inactive region 130 between the first active region 110 and the second active region 120 according to one example. In this example, the inactive region 130 includes inactive transistor cells $20_3$. These inactive transistor cells include a gate electrode $23_3$. This gate electrode may be electrically connected with the gate electrodes of the load transistor cells $20_1$ and the sense transistor cells $20_2$. The inactive transistor cells 203 include body regions but $22_3$ do not include source regions. For the purpose of illustration, load transistor cells $20_1$ and sense transistor cells $20_2$ integrated in those regions of the first region 110 and the second region 120 adjoining the inactive region 130 are also illustrated in FIG. 16. Just for the purpose of illustration, these transistor cells $20_1$, $20_2$ are implemented as explained with reference to FIG. 13. This, however, is only an example. The transistor cells $20_1$, $20_2$ may be implemented with other topologies as well.

Implementing the transistor arrangement such that it includes inactive transistor cells $20_3$ in the inactive region 130 is only an example. According to another example (not shown) these inactive transistor cells $20_3$ are omitted.

FIG. 14 shows a horizontal cross-sectional view of one example of the transistor arrangement in a horizontal section plane D-D that extends through the first source metallization $31_1$ of the load transistor Q1 and the second source metallization $31_2$ of the sense transistor Q2. The first source metallization $31_1$ may form the first source node S1 or may be connected to the first load node S1 by one or more further conductors such as a bond wire or a clip. Resistances of the first source metallization $31_1$ and of these optional further conductors form the source conductor resistance $R30_1$ explained above. The source metallization $31_1$ may include copper (Cu), a copper alloy, tungsten (W), or a tungsten alloy for example.

Figure 15:
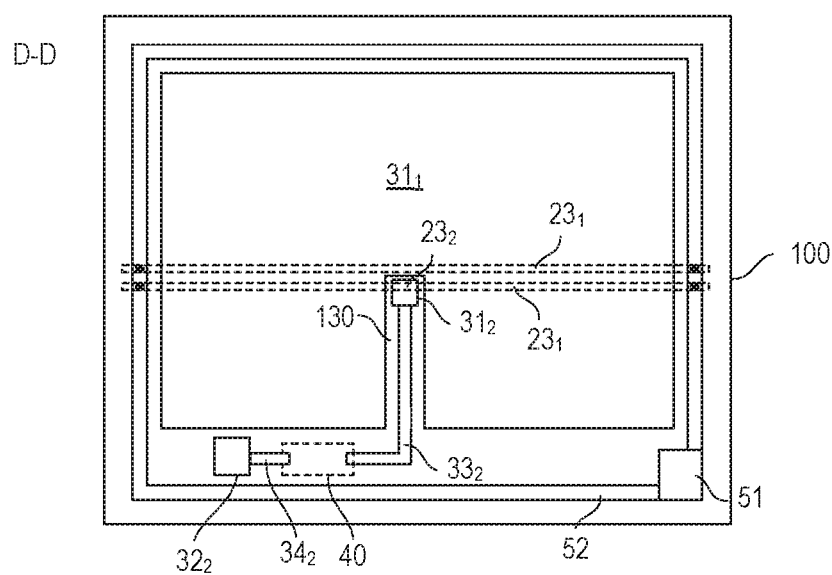
FIG. 15 shows a top view of source metallizations, a gate runner, and a gate pad of the transistor arrangement.

Referring to FIG. 15, the second source metallization $31_2$ is connected to a sense pad $32_2$. The sense pad $32_2$ may form the second source node S2 or may be connected to the second source node S2 by one or more further conductors such as a bond wire or a clip. The compensation resistor 40 is connected between the second source metallization $31_2$ and the sense pad $32_2$. The compensation resistor 40 is implemented in the semiconductor body 100 below the horizontal plane illustrated in FIG. 15, wherein the position of the compensation resistor 40 in the semiconductor body is illustrated in dashed lines in FIG. 15. The second source metallization $31_2$ may be connected to the first contact (43 in FIGS. 8A and 9) of the compensation resistor 40 by a first conductor $33_2$, and the sense pad $32_2$ may be connected to the second contact (44 in FIGS. 8A and 9) of the compensation resistor 40 by a second conductor $34_2$ so that the compensation resistor 40 is connected between the source metallization $31_2$ and the sense pad $32_2$. Resistances of the second source metallization $31_2$, the first and second conductor $33_2$, $34_2$, of the sense pad $32_2$ and of the optional conductors connected to the sense pad $32_2$ form the second source conductor resistance $R30_2$ explained above. The second source metallization $31_2$, the first and second conductor $33_2$, $34_2$ and the sense pad $32_2$ may include copper (Cu), a copper alloy, tungsten (W), or a tungsten alloy, for example.

By suitably selecting the material and dimension of the first source metallization $31_1$ (and of the optional further conductors connected between the first source metallization $31_1$ and the first source node S1) and the material and dimension of the second source metallization $31_2$, the first and second conductors $33_2$, $34_2$, and the sense pad $32_2$ (and of the optional further conductors connected between the sense pad $32_2$ and the second source node S2) the proportionality factor $k_{ILIS\_30}$ (=$R30_2/R30_1$) between the source conductor resistances $R30_1$, $R30_2$ can be adjusted. According to one example, (1) the source conductors $30_1$, $30_2$ are implemented such that the source conductor resistances $R30_1$, $R30_2$ have essentially the same temperature coefficient, which can be achieved by suitably selecting the materials of the source conductors $30_1$. $30_2$, and (2) the proportionality factor $k_{ILIS\_30}$ is adjusted such that it essentially equals the proportionality factor $k_{ILIS\_20}$ of the cell resistances $R20_1$, $R20_2$. In this case, the source conductors $30_1$. $30_2$ do not cause a temperature dependent variation of the overall current proportionality factor $k_{ILIS}$. "Essentially equals" means that proportionality factor $k_{ILIS\_30}$ deviates less than 20%, less than 10%, or even less than 5% from the proportionality factor $k_{ILIS\_20}$.

Referring to FIG. 15, the transistor arrangement further includes a gate pad 51 and at least one gate runner 52. The at least one gate runner 52 is connected to the gate pad 51 and to the gate electrodes 23₁, 23₂ of the load transistor cells 20₁ (not shown in FIG. 15) and the sense transistor cells 20₂ (not shown in FIG. 15). For illustration purposes, the position of two elongated electrodes, each forming the gate electrode of one or more transistor cells, are illustrated in dashed lines in FIG. 15. As can be seen from Figure, these electrodes, in their respective longitudinal direction, extend to below the gate runner 52 and are electrically connected to the gate runner 52. The gate electrodes may be connected to the gate runner 52 by electrically conducting vias (not shown in FIG. 15 and represented by a black dot). Referring to FIG. 15, one and the same elongated electrode may form the gate electrode of one or more load transistor cells 20₁ and one or more sense transistor cells 20₂. Source regions (not shown in FIG. 15) of the load transistor cells 20₁ (see FIG. 14, for example) and the sense transistor cells 20₂, however, are separated from each other. One and the same doped region may form the body region of one or more load transistor cells 20₁ and one or more sense transistor cells 20₂. According to another example, body regions of the load transistor cells are separated from body regions of the sense transistor cells 20₂.

Referring to FIG. 15, the compensation resistor may be implemented inside a ring formed by the gate runner 52.

The optional field electrode 26, illustrated in FIG. 11, may be connected to the respective source metallization 31₁, 31₂ in various ways (not illustrated in the drawings). According to one example, the field electrode 26 is connected to the source metallization by an electrically conducting via that extends from the field electrode 26 to the source metallization 31₁, 31₂ in the inner region 110 of the semiconductor body 100. Various kinds of connections between a field electrode and a source metallization in a transistor device of the type explained above are commonly known so that no further explanation is required in this regard.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A transistor arrangement, comprising:
a load transistor; and
a sense transistor,
wherein each of the load transistor and the sense transistor comprises a respective portion of a drift region and a drain region arranged in a semiconductor body and connected to a drain node,
wherein the load transistor further comprises:
at least one load transistor cell comprising a source region integrated in a first active region of the semiconductor body; and
a first source node electrically coupled to the source region of the at least one load transistor cell,
wherein the sense transistor further comprises:
at least one sense transistor cell comprising a source region integrated in a second active region of the semiconductor body;
a second source node electrically coupled to the source region of the at least one sense transistor cell; and
a compensation resistor connected between the source region of the at least one sense transistor cell and the second source node,
wherein the compensation resistor is integrated in the semiconductor body and comprises a resistive conductor, and
wherein the resistive conductor comprises a doped semiconductor material,
wherein the load transistor, in an on-state, has a first internal resistance resulting from portions of the load transistor located inside the semiconductor body between the drain node and the source region of the at least one load transistor cell and including the source region of the at least one load transistor cell,
wherein the load transistor has a first external resistance resulting from portions of the load transistor between the source region of the at least one load transistor cell and the first source node,
wherein the sense transistor, in an on-state, has a second internal resistance resulting from portions of the sense transistor located inside the semiconductor body between the drain node and the source region of the at least one sense transistor cell and including the source region of the at least one sense transistor cell,
wherein the sense transistor comprises a second external resistance resulting from portions of the sense transistor between the source region of the at least one load transistor cell and the second source node, and
wherein a first ratio between the second external resistance and the first external resistance is different from a second ratio between the second internal resistance and the first internal resistance.

2. The transistor arrangement of claim 1, wherein the greater one of the first ratio and the second ratio is between 105% and 250% of the smaller one of the first ratio and the second ratio.

3. The transistor arrangement of claim 1, wherein the doped semiconductor material comprises doped polysilicon.

4. The transistor arrangement of claim 3, wherein a doping concentration of the doped semiconductor material is in a range between $5E18$ cm$^{-3}$ and $5E20$ cm$^{-3}$.

5. The transistor arrangement of claim 1, wherein the resistive conductor has a compensation resistance with a temperature coefficient, and wherein the temperature coefficient of the compensation resistance has a magnitude that is lower than a magnitude of a temperature coefficient of a load transistor on-resistance between the drain node and the first source node.

6. The transistor arrangement of claim 1, wherein the compensation resistor is integrated in an edge region of the semiconductor body.

7. The transistor arrangement of claim 1, wherein an area of the first active region is at least 500 times an area of the second active region.

8. The transistor arrangement of claim 1, further comprising:
an inactive region between the first active region and the second active region.

9. The transistor arrangement of claim 8, wherein the inactive region comprises inactive transistor cells.

10. The transistor arrangement of claim 1, wherein each of the at least one load transistor cell and each of the at least one sense transistor cell further comprises:
a body region; and
a gate electrode dielectrically insulated from the body region by a gate dielectric and connected to a common gate node.

11. The transistor arrangement of claim 10, wherein each of the at least one load transistor cell and each of the at least one sense transistor cell further comprises:
a field electrode dielectrically insulated from the drift region and the drain region by a field electrode dielectric.

12. An electronic circuit, comprising:
a transistor arrangement comprising a load transistor and a sense transistor, wherein each of the load transistor and the sense transistor comprises a respective portion of a drift region and a drain region arranged in a semiconductor body and connected to a drain node, wherein the load transistor further comprises: at least one load transistor cell comprising a source region integrated in a first active region of the semiconductor body; and a first source node electrically coupled to the source region of the at least one load transistor cell, wherein the sense transistor further comprises: at least one sense transistor cell comprising a source region integrated in a second active region of the semiconductor body; a second source node electrically coupled to the source region of the at least one sense transistor cell;
and a compensation resistor connected between the source region of the at least one sense transistor cell and the second source node, wherein the compensation resistor is integrated in the semiconductor body and comprises a resistive conductor,
wherein the resistive conductor comprises a doped semiconductor material; and
a regulator connected to the first source node and the second source node and configured to regulate a potential at the second source node such that the potential at the second source node essentially equals the potential at the first source node.

13. The electronic circuit of claim 12,
wherein the load transistor, in an on-state, has a first internal resistance resulting from portions of the load transistor located inside the semiconductor body between the drain node and the source region of the at least one load transistor cell and including the source region of the at least one load transistor cell,
wherein the load transistor has a first external resistance resulting from portions of the load transistor between the source region of the at least one load transistor cell and the first source node,
wherein the sense transistor, in an on-state, has a second internal resistance resulting from portions of the sense transistor located inside the semiconductor body between the drain node and the source region of the at least one sense transistor cell and including the source region of the at least one sense transistor cell,
wherein the sense transistor comprises a second external resistance resulting from portions of the sense transistor between the source region of the at least one load transistor cell and the second source node, and
wherein a first ratio between the second external resistance and the first external resistance is different from a second ratio between the second internal resistance and the first internal resistance.

14. The electronic circuit of claim 12, wherein the doped semiconductor material comprises doped polysilicon.

15. The electronic circuit of claim 12, wherein the resistive conductor has a compensation resistance with a temperature coefficient, and wherein the temperature coefficient of the compensation resistance has a magnitude that is lower than a magnitude of a temperature coefficient of a load transistor on-resistance between the drain node and the first source node.

16. The electronic circuit of claim 12, wherein the compensation resistor is integrated in an edge region of the semiconductor body.

17. The electronic circuit of claim 12, wherein an area of the first active region is at least 500 times an area of the second active region.

18. The electronic circuit of claim 12, further comprising:
an inactive region between the first active region and the second active region.

19. The electronic circuit of claim 12, wherein each of the at least one load transistor cell and each of the at least one sense transistor cell further comprises:
a body region; and
a gate electrode dielectrically insulated from the body region by a gate dielectric and connected to a common gate node.

* * * * *